United States Patent [19]
Wang

[11] Patent Number: 5,587,881
[45] Date of Patent: Dec. 24, 1996

[54] POWER SUPPLY CHASSIS FOR PERSONAL COMPUTERS

[76] Inventor: Joseph Wang, No. 18-3, Lane 197, Fuerh St., Keelung, Taiwan

[21] Appl. No.: 579,308

[22] Filed: Dec. 27, 1995

[51] Int. Cl.$^6$ .................................................. H05K 7/20
[52] U.S. Cl. ................................. 361/695; 361/730
[58] Field of Search ..................................... 361/685, 687, 361/694–697, 728, 730, 733, 752, 725–727, 829, 830

[56] References Cited

U.S. PATENT DOCUMENTS

| | | | |
|---|---|---|---|
| 3,305,704 | 2/1967 | Battista | 361/697 |
| 4,479,198 | 10/1984 | Romano et al. | 361/687 |
| 4,739,445 | 4/1988 | Tragen | 361/687 |
| 4,977,532 | 12/1990 | Borkowicz et al. | 361/685 |
| 5,260,851 | 11/1993 | Chiou | 361/685 |
| 5,419,629 | 5/1995 | Korinsky | 361/685 |

FOREIGN PATENT DOCUMENTS 3015595  8/1993  WIPO .............................. 361/687

*Primary Examiner*—Gregory D. Thompson
*Attorney, Agent, or Firm*—Merchant, Gould, Smith, Edell, Welter & Schmidt, P.A.

[57] ABSTRACT

A power supply chassis for personal computers includes a bottom plate, a first wall plate defining a rail horizontally extending at a mediate height of the wall, a second wall plate adjacent to the first wall plate, a top plate supported by the first and the wall plates, and a wall frame coupled with the bottom plate, the second wall plate, and the top plate for defining a channel and having a plate defining a fan-frame vent, a guide facing the rail on the first wall plate as to divide the channel into a first and a second compartments each slidably receiving a power supply cartridge, a fan fixedly secured within the frame in a direction of facing the fan-frame vent for expelling out of the chassis heat generated by the power supply cartridges out of the chassis, a power receptacle provided adjacent to an entrance of the channel for receiving a power cable.

7 Claims, 3 Drawing Sheets

5,587,881

POWER SUPPLY CHASSIS FOR PERSONAL COMPUTERS

BACKGROUND OF THE INVENTION

The present invention relates to a power supply, and particularly to a power supply chassis which is as compact as current standard PS/2 power supply for personal computers.

A power supply device is essential for outputting a steady voltage and a steady current to electronics of a personal computer (PC). However, the lifetime of a power supply is limited. Once the power supply fails to output the power required by the personal computer, thus, the tasks executed by the personal computer have to be stopped whilst fitting a new power supply. A backup power supply could be an approach for overcoming this disadvantage. However, as the inner space of a PC is limited, it is almost impossible to permit an additional power supply to occupy significant space within a PC. Besides, most PC cases are standardized, so the present invention can be used to add value and achieve a best commercial competition.

SUMMARY OF THE INVENTION

An object of the present invention is to provide a compact power supply chassis for PCs which has the same size and volume as a conventional power supply chassis and an additional slot for installing a backup power supply.

Another object of the present invention is to provide a compact power supply chassis for PCs which enjoys a higher flexibility in the orientation of the fan, which expels the heat generated by the power supplies and make the power supply stable.

A further object of the present invention is to provide a power supply chassis for. PCs which is easy to maintain.

According to the present invention, a power supply chassis for personal computers includes a bottom plate, a first wall plate defining a rail horizontally extending along a mediate height of the wall plate, a second wall plate adjacent to the first wall plate, a top plate supported by the first and the second wall plates, and a wall frame coupled with the bottom plate, the second wall plate, and the top plate for defining a channel and having a plate defining a fan-frame vent, a guide facing the rail on the first wall plate as to divide the channel into a first compartment and a second compartment, each slidably receiving a power supply cartridge, a fan fixedly secured within the frame in a direction of facing the fan-frame vent for expelling out of the chassis heat generated by the power supply cartridges, a power receptacle provided adjacent to an entrance of the channel for receiving a power cable.

Other objects, advantages, and novel features of the invention will become more apparent from the following detailed description when taken in conjunction with the accompanying drawings.

DETAILED DESCRIPTION OF THE PREFERRED EMBODIMENTS

Figure 1:
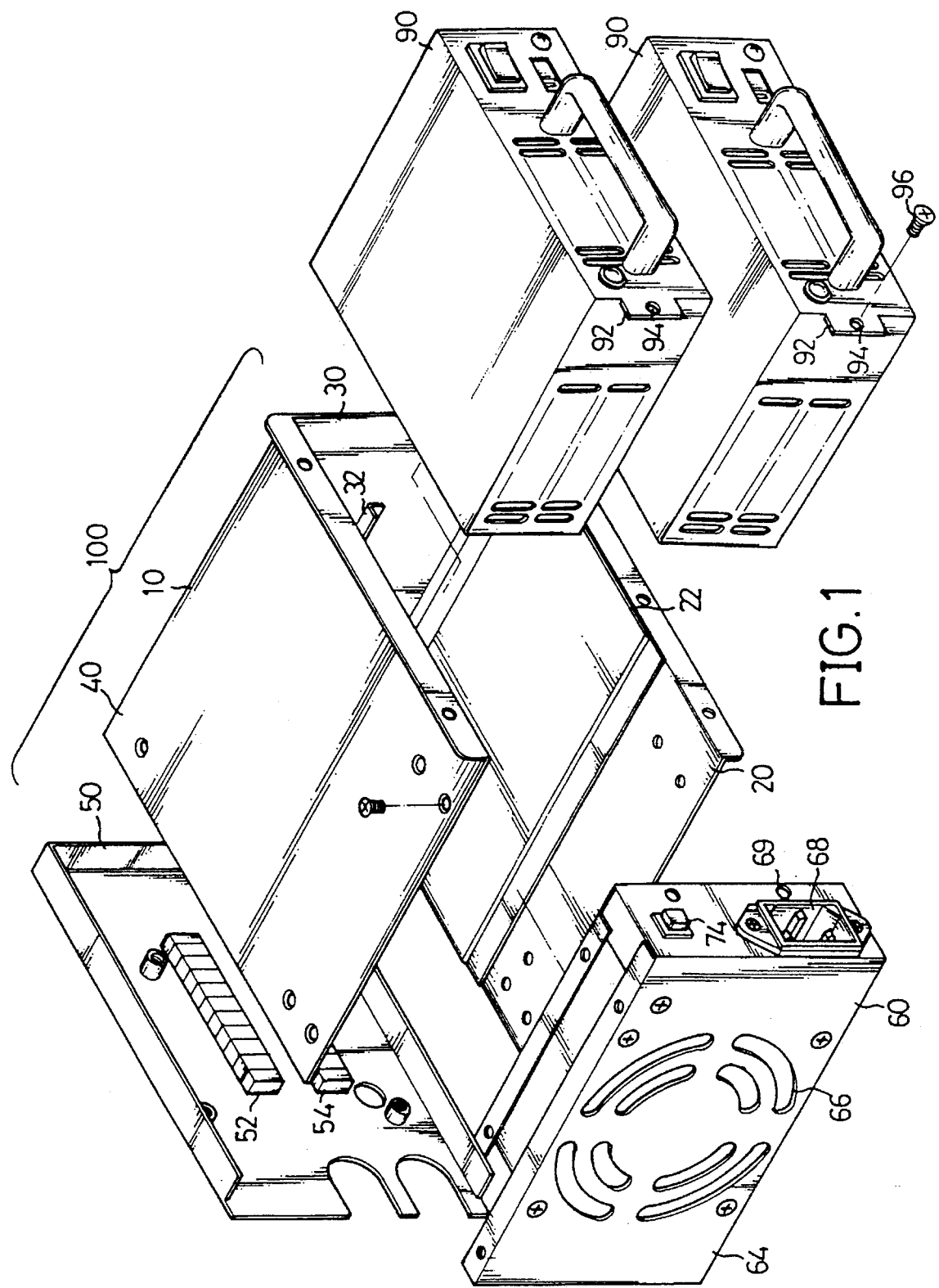
FIG. 1 is a perspective exploded view of a power supply chassis for a personal computer according to the present invention.

Referring now to drawings wherein like reference characters designate identical or corresponding parts through the several views.

Figure 2:
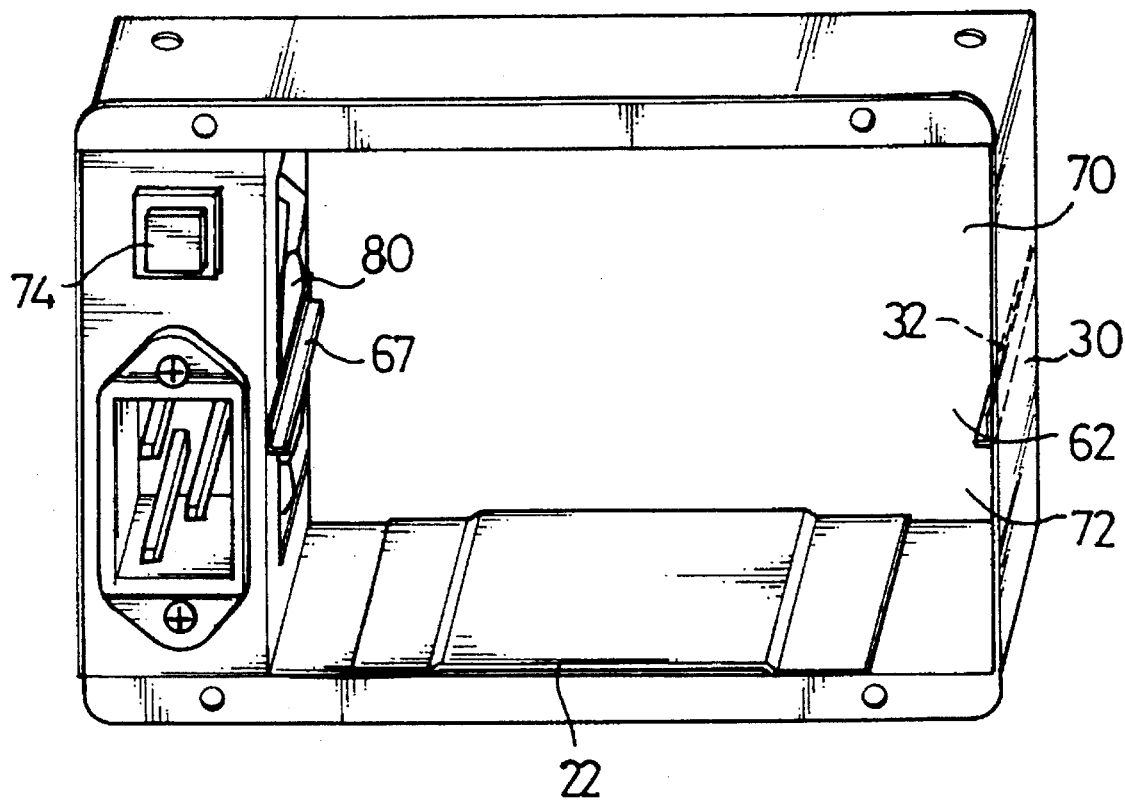
FIG. 2 is a schematic view of the power supply chassis of FIG. 1.

As shown in FIGS. 1 and 2, a power supply chassis 100 for a personal computer includes a member 10 composed of a bottom plate 20, a first wall plate 30, and a top plate 40, a second wall plate 50, a wall frame 60 coupling with the bottom plate 20, the second wall plate 50, and the top plate 40 as to define a channel 62 as shown in FIG. 2. Two power supply cartridges 90 are slidably received within the channel 62.

The first wall plate 30 has a rail 32 horizontally extending along a mediate height of the wall plate 30. The wall frame 60 has a plate 64 defining a fan-frame vent 66, a guide 67 facing the rail 32 on the first wall plate 30 as to divide the channel 62 into two compartments 70, 72 for receiving the power supply cartridges 90, a fan 80 fixedly secured within the frame 60 in a direction of facing the fan-frame vent 66 for expelling out of the chassis 100 heat generated by electronics of the power supply cartridges 90, and a power receptacle 68 provided adjacent to an entrance of the channel for electrically coupling with a power cord (not shown). A tact switch 74 is provided adjacent to the receptacle 68 for switching between the power supply cartridges 90 when one of the power supply cartridges 90 has failed. As shown in FIG. 2, the bottom plate 20 and the top plate 40 are symmetric in outer configurations so that the chassis of the present invention can enjoy a higher flexibility in the orientation of the fan. This is not achievable by a conventional power supply chassis.

The second wall plate 50 has two sockets 52, 54 for electrically coupling with the power supply cartridges 90 when the cartridges 90 are received within the channel 62. The power supply cartridges 90 each has a tooth 92 extending toward the wall frame 60 and defining an aperture 94 for a screw 96 to extend therethrough and engage with a threaded periphery defining a hole 69 thereby securing the cartridges 90 in place.

Figure 3:
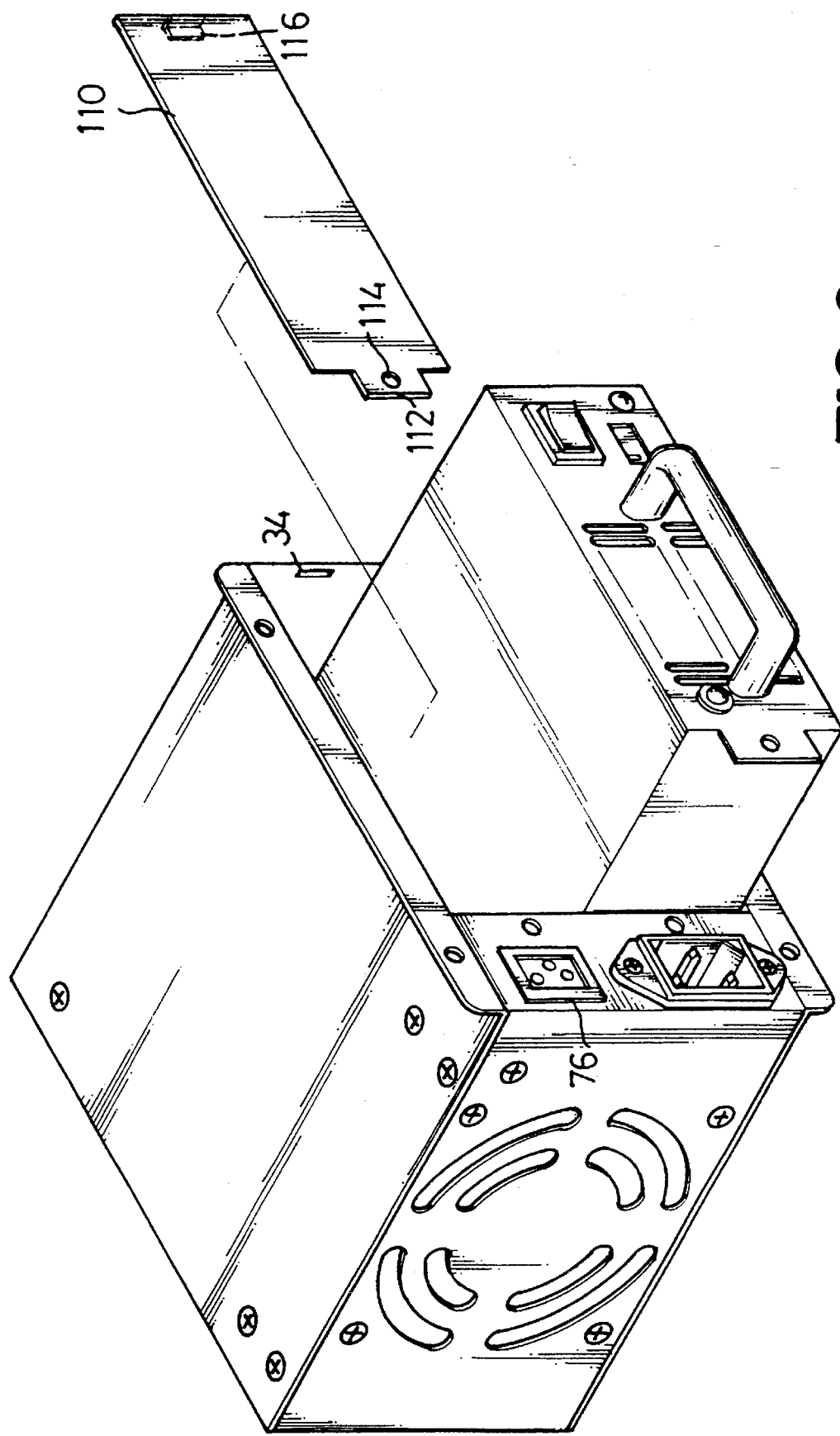
FIG. 3 is a schematic view of another arrangement of the power supply chassis according to the present invention.

Referring to FIG. 3, in a case where one of the power supply cartridges 90 has failed, a cover plate 110 is provided for protecting the electronics of the power supply from dust contamination and obstacle intrusion. The first wall plate 30 is further provided with a groove 34. The cover plate 110 has an angled tab 116 formed in a first end for extending into the groove 34 in the first wall plate 30, a tooth 112, an aperture 114 in a second end opposite to the first end for a screw extend therethrough as to secure the cover plate 110 onto the wall frame 60. Preferably, the bottom plate 20 also defines a slot 22 as shown in FIGS. 1 and 2 for storing the cover plate 110 when the failed power supply cartridge 90 is repaired and the cover plate 110 is no longer needed. The tact switch 74 as shown in FIGS. 1 and 2 can be replaced by an output power jack 76 as shown in FIG. 3 for outputting electric power to a monitor as in conventional PCs.

Although the invention has been explained in relation to its preferred embodiment, it is to be understood that many other possible modifications and variations can be made without departing from the spirit and scope of the invention as hereinafter claimed.

What is claimed is:

1. A power supply chassis for personal computers comprising:

a bottom plate;

a first wall plate defining a rail horizontally extending therealong at a mediate height thereof;

a second wall plate adjacent to the first wall plate;

a top plate supported by the first and the second wall plates; and a wall frame coupled with the bottom plate, the second wall plate, and the top plate for defining a channel and having a plate defining a fan-frame vent, a guide facing the rail on the first wall plate as to divide the channel into a first compartment and a second compartment each slidably receiving a corresponding power supply cartridge, a fan fixedly secured within the frame in a direction of facing the fan-frame vent for expelling out of the chassis heat generated by the power supply cartridges out of the chassis, a first socket and a second socket on the second wall plate each respectively coupling with a corresponding power supply cartridge, and a power receptacle provided adjacent to an entrance of the channel for receiving a power cable.

2. A power supply chassis as claimed in claim 1, wherein said bottom plate, the first wall plate, the second wall plate, and the top plate are integrally formed.

3. A power supply chassis as claimed in claim 1 further comprising a cover plate coupled between the wall frame and the first wall plate and sized to close a half of the entrance of the channel when either one of the power supply cartridges is vacant.

4. A power supply chassis as claimed in claim 3 further comprising at least one groove defining in an edge of the first wall plate and at least one angled tab protruding from the edge of the cover plate facing the first wall plate for engaging with the corresponding grooves.

5. A power supply chassis as claimed in claim 3 wherein said bottom plate defining a slot for receiving the cover plate.

6. A power supply chassis as claimed in claim 1 further comprising a tact switch adjacent to the power receptacle.

7. A power supply chassis as claimed in claim 1 further comprising a power jack adjacent to the power receptacle for outputting power to a monitor.

* * * * *